United States Patent

Oyama

Patent Number: 5,929,479
Date of Patent: Jul. 27, 1999

[54] FLOATING GATE TYPE NON-VOLATILE SEMICONDUCTOR MEMORY FOR STORING MULTI-VALUE INFORMATION

[75] Inventor: Kenichi Oyama, Tokyo, Japan

[73] Assignee: NEC Corporation, Tokyo, Japan

[21] Appl. No.: 08/954,924

[22] Filed: Oct. 21, 1997

[30] Foreign Application Priority Data

Oct. 21, 1996 [JP] Japan .................................. 8-277747

[51] Int. Cl.$^6$ .......................... H01L 29/76; H01L 29/788; H01L 29/792
[52] U.S. Cl. .......................... 257/315; 257/314; 257/321; 257/324
[58] Field of Search ................... 257/296–324; 438/257–264

[56] References Cited

U.S. PATENT DOCUMENTS

| 5,291,047 | 3/1994 | Iwasa ........................................ 257/318 |
| 5,446,299 | 8/1995 | Acovic et al. ............................ 257/321 |
| 5,488,243 | 1/1996 | Tsuruta et al. ........................... 257/314 |
| 5,751,037 | 5/1998 | Aozasa et al. ........................... 257/315 |

FOREIGN PATENT DOCUMENTS

| 63-283071 | 11/1988 | Japan . |
| 2-244767 | 9/1990 | Japan . |
| 5-82787 | 4/1993 | Japan . |
| 405226664 | 9/1993 | Japan ..................................... 257/315 |

Primary Examiner—Tom Thomas
Assistant Examiner—Cuong Quang Nguyen
Attorney, Agent, or Firm—Foley, Hoag & Eliot LLP

[57] ABSTRACT

A non-volatile semiconductor memory cell comprises a diffused layer or silicide layer formed in a surface of semiconductor substrate within an opening of an insulating layer formed on the semiconductor substrate, a first floating gate electrode formed on a first gate insulator film formed on the diffused or silicide layer within the opening of the insulating layer, and a semiconductor thin film formed to cover a second gate insulator film formed on the first floating gate electrode. The semiconductor thin film includes a channel region positioned above the first floating gate electrode and a pair of source/drain regions separated from each other by the channel region. The memory cell also includes a second floating gate electrode formed on a third gate insulator film formed on the semiconductor thin film, and a second control gate electrode formed on a fourth gate insulator film formed on the second floating gate electrode. Thus, a first floating gate transistor is formed of the channel region, the pair of source/drain regions, the first floating gate electrode and the first control electrode, and a second floating gate transistor is formed of the channel region, the pair of source/drain regions, the second floating gate electrode and the second control gate electrode, whereby one memory cell is constituted of the first and second floating gate transistors to be able to store multi-value information to elevate an integration density per bit.

20 Claims, 10 Drawing Sheets

FLOATING GATE TYPE NON-VOLATILE SEMICONDUCTOR MEMORY FOR STORING MULTI-VALUE INFORMATION

BACKGROUND OF THE INVENTION

1. Field of the Invention

The present invention relates to a non-volatile semiconductor memory and a method for manufacturing the same, and more specifically to an improved structure of a non-volatile semiconductor memory of a floating gate type capable of storing multi-value information.

2. Description of Related Art

A floating gate transistor has been well known as a programmable and erasable non-volatile memory cell. This floating gate transistor generally includes a source region and a drain region formed in a surface region of a semiconductor substrate, separately from each other, to form a channel region between the source region and the drain region. On this channel region, there are formed a first insulator film, a floating gate, a second insulator film and a control gate in the named order.

In the floating gate transistor, ordinarily, a first level gate electrode (floating gate) is formed on a silicon nitride film formed on a principal surface of the semiconductor substrate, and an interlayer insulator film composed of a silicon oxide film and a silicon nitride film is formed on the first gate electrode, and then, a second level gate electrode (control gate) is formed on the interlayer insulator film.

In this construction, an electric charge for non-volatile stored information is stored in the floating gate formed of the first level gate electrode. Here, the information electric charge is written by injecting electrons into the floating gate electrode from the semiconductor substrate, and the information electric charge is erased by discharging or extracting electrons from the floating gate electrode into the semiconductor substrate.

In this type of non-volatile memory, the difference of a threshold caused by the difference in an electric charge storing condition of the floating gate is memorized as data "0" or data "1". Namely, a bit of information is memorized in the floating gate.

In a non-volatile semiconductor memory composed of floating gate transistors as mentioned above, it has become important to elevate an integration density. Under this demand, Japanese Patent Application Pre-examination Publication No. JP-A-5-082728, (the content of the which is incorporated by reference in its entirety into this application, and also an English abstract of JP-A-5-082728 is available from the Japanese Patent Office and the content of the English abstract of JP-A-5-082728 is also incorporated by reference in its entirety into this application) proposes a non-volatile semiconductor memory including a floating gate transistor having a thin film transistor structure.

Now, the non-volatile semiconductor memory having the thin film transistor structure will be described with reference to FIG. 1, which is a diagrammatic section view of the floating gate transistor of this non-volatile semiconductor memory.

As shown in FIG. 1, on a semiconductor substrate 101, an interlayer insulator film 102 is formed, and a semiconductor thin film 103 is formed on the interlayer insulator film 102. A pair of source/drain regions 103 and a channel region 103b are formed in the semiconductor thin film 103. Furthermore, a first level insulator film 104 is formed to cover a surface of the channel region 103b, and a floating gate electrode 105 is formed on the first level insulator film 104 to extend over the channel region 103b.

Furthermore, a second level insulator film 106 is formed to cover the floating gate electrode 105, and a control gate electrode 107 is formed on the second level insulator film 106 to extend over the floating gate electrode 105. The control gate electrode 107 is covered with an insulator film 108.

In order to further elevate the integration density of the above mentioned non-volatile memory, it is attempted to reduce a size of the floating gate electrode and a spacing between memory cells. However, this reduction of the semiconductor device size is dependent upon a degree of patterning precision in a photolithography and in a dry etching.

In a reduction projection exposure which is ordinarily used, however, the degree of patterning precision in the photolithography is limited by resolution. Therefore, microminiaturization of the floating gate transistor has a limit, and therefore, elevation of the integration density of the non-volatile memory has a limit.

Furthermore, in the prior art, it is possible to form another floating gate transistor having the thin film transistor as mentioned above, on an interlayer insulator film formed on the floating gate transistor formed on the surface of the semiconductor substrate. This structure can elevate the integration density of the non-volatile memory. In this structure, however, a memory cell region of the non-volatile semiconductor memory projects in the form of a convex, and becomes higher than the other region on the semiconductor chip, with the result that the degree of planarization is deteriorated. Furthermore, unevenness of focus occurs in an exposure step of the photolithography. As a result, microfabrication of the floating gate transistor becomes difficult.

As mentioned above, in the prior art structure, the integration density of the non-volatile memory is limited by a minimum dimension determined by a manufacturing process attributable to the structure, and therefore, it is not possible to further elevate the integration density.

SUMMARY OF THE INVENTION

Accordingly, it is an object of the present invention to provide an improved structure of a floating gate type non-volatile semiconductor memory which has overcome the above mentioned defect of the conventional one.

Another object of the present invention is to provide an improved structure of a floating gate type non-volatile semiconductor memory having an occupying area per bit, by storing information in each one memory cell in a multi-value condition.

The above and other objects of the present invention are achieved in accordance with the present invention by a non-volatile semiconductor memory including a non-volatile semiconductor memory cell comprising:

a semiconductor substrate of a first conductivity type;

an insulating layer covering a principal surface of the semiconductor substrate; the insulating layer having an opening penetrating through the insulating layer;

a first control electrode formed in the principal surface of the semiconductor substrate within the opening of the insulating layer, the first control electrode being electrically isolated from the semiconductor substrate;

a first gate insulator film formed on the diffused region within the opening of the insulating layer;

a first floating gate electrode formed on the first gate insulator film within the opening of the insulating layer;

a second gate insulator film formed to cover a surface of the first floating gate electrode;

a semiconductor thin film formed to cover the second gate insulator film and to partially cover the insulating layer, the semiconductor thin film including a channel region positioned above the first floating gate electrode and a pair of source/drain regions separated from each other by the channel region and partially covering the insulating layer;

a third gate insulator film formed to cover the semiconductor thin film;

a second floating gate electrode formed on the third gate insulator film to extend over the channel region of the semiconductor thin film;

a fourth gate insulator film formed to cover the second floating gate electrode; and a second control gate electrode formed on the fourth gate insulator film, so that a first floating gate transistor is formed of the channel region, the pair of source/drain regions, the first floating gate electrode and the first control electrode, and a second floating gate transistor is formed of the channel region, the pair of source/drain regions, the second floating gate electrode and the second control gate electrode, whereby one memory cell is constituted of the first and second floating gate transistors to be able to store multi-value information.

In one embodiment of the non-volatile semiconductor memory, the first control electrode is constituted of a diffused region formed in the principal surface of the semiconductor substrate within the opening of the insulating layer, the diffused region being of a second conductivity type opposite to the first conductivity type.

The non-volatile semiconductor memory cell of another embodiment further includes a diffused region formed in the principal surface of the semiconductor substrate within the opening of the insulating layer, the diffused region being of a second conductivity type opposite to the first conductivity type, and the first control gate electrode is constituted of a silicide layer which is formed in a surface region of the diffused layer and which is in contact with the first gate insulator film, so that the first floating gate transistor being formed of the channel region, the pair of source/drain regions, the first floating gate electrode and the silicide layer.

Preferably, a film thickness, calculated in terms of a silicon oxide film thickness, of the second gate insulator film, is different from that of the third insulator film.

In addition, a first channel region of the first floating gate transistor is constituted of a portion of the channel region adjacent to the second gate insulator film, and a second channel region of the second floating gate transistor is constituted of a portion of the channel region adjacent to the third gate insulator film. The semiconductor thin film having a thickness to prevent the first channel region and the second channel region from being in contact with each other.

With the above mentioned construction, an electric charge is accumulated in the first floating gate electrode, independently of the second floating gate electrode, and an electric charge is accumulated in the second floating gate electrode, independently of the first floating gate electrode. Conductivity of the first channel region and conductivity of the second channel region are controlled by the first floating gate electrode and the second floating gate electrode, respectively, but independently of each other. Thus, one non-volatile semiconductor cell can simultaneously store two bits of information. Accordingly, the integration density per bit can be remarkably increased in comparison with the prior art non-volatile semiconductor memory cell storing only one bit of information.

DESCRIPTION OF THE PREFERRED EMBODIMENTS

Figure 1:
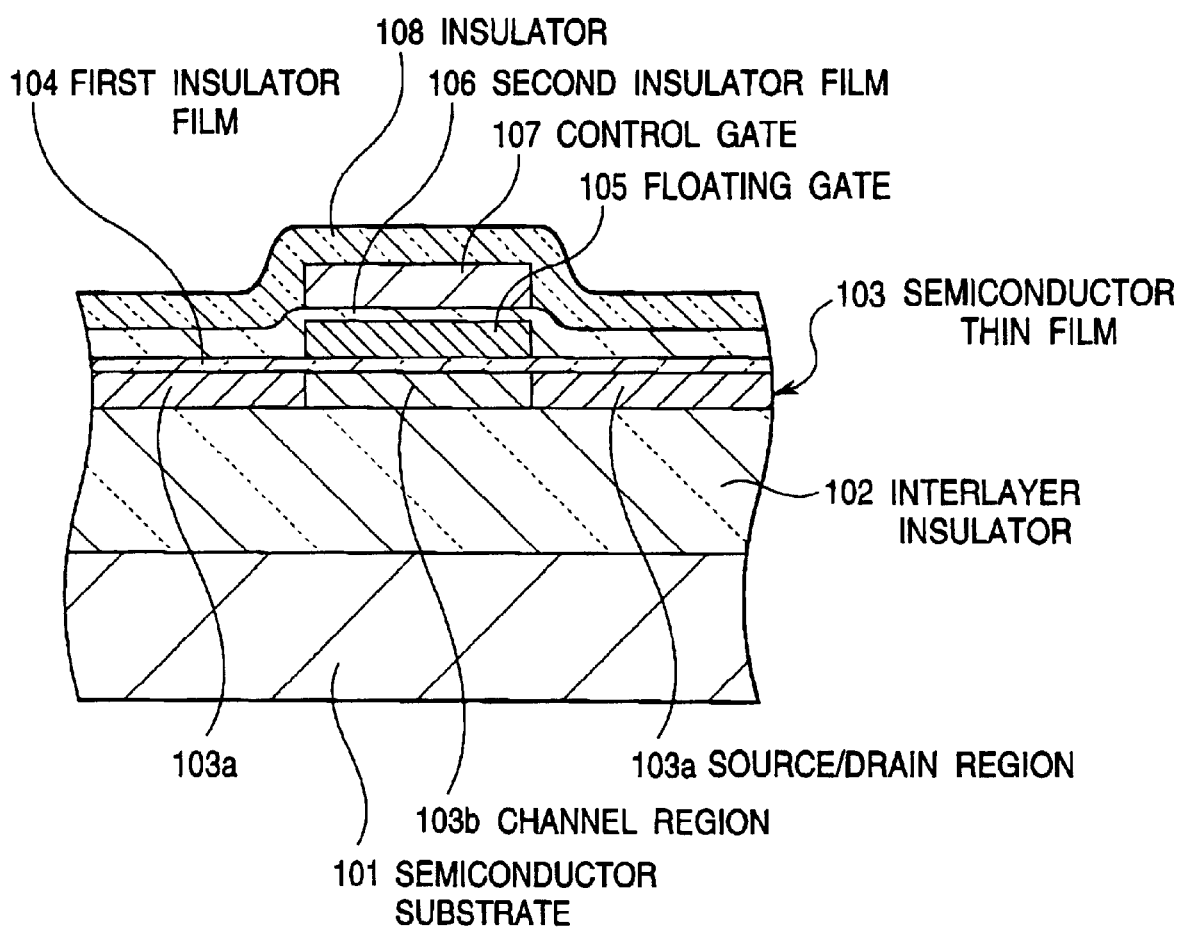
FIG. 1 is a diagrammatic section view of the floating gate transistor of a prior art non-volatile semiconductor memory.
Figure 2:
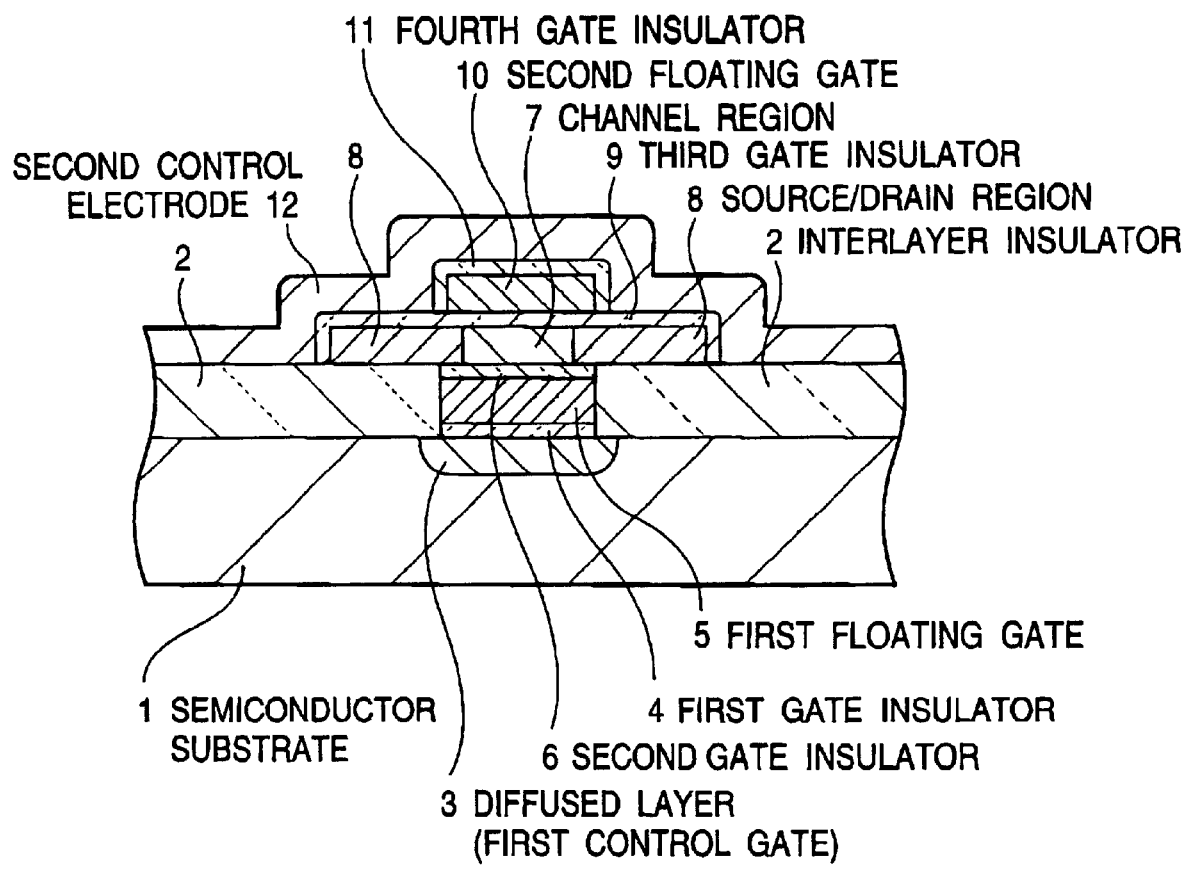
FIG. 2 is a diagrammatic section view of a first embodiment of the non-volatile semiconductor memory cell in accordance with the present invention.

Referring to FIG. 2, there is shown a diagrammatic section view of a first embodiment of the non-volatile semiconductor memory cell in accordance with the present invention.

The shown non-volatile semiconductor memory cell has an interlayer insulator film 2 selectively formed on a semiconductor substrate 1 of a first conductivity type. A diffused layer 3 of a second conductivity type opposite to the first conductivity type, is formed in a surface of the semiconductor substrate 1 within an opening formed to penetrate through the interlayer insulator film 2 at a predetermined area. This diffused layer 2 constitutes a first control electrode in the first embodiment of the non-volatile semiconductor memory cell in accordance with the present invention.

A first gate insulator film 4 is formed on a surface of the diffused layer 3, and a first floating gate electrode 5 is formed on the first gate insulator film 4 so that the first floating gate electrode 5 is completely embedded within the opening of the interlayer insulator film 2. In addition, a second gate insulator film 6 is formed on a surface of the first floating gate electrode 5 so that the second gate insulator film 6 is also embedded within the opening of the interlayer insulator film 2 and a surface of the second gate insulator film 6 is flush with the surface of the interlayer insulator film 2.

Furthermore, a channel region 7 for a thin film transistor is formed on the second gate insulator film 6, and a pair of source/drain regions 8 are formed at both sides of the channel region 7 on the second gate insulator film 6 and the interlayer insulator film 2. A third gate insulator film 9 is formed to cover the channel region 7 and the source/drain regions 8.

A second floating gate electrode 10 is formed on the third gate insulator film 9 at a position above the channel region 7 of the thin film transistor. A fourth gate insulator film 11 is formed to completely cover a surface of the second floating gate electrode 10. A second control gate electrode 12 is formed to cover the fourth gate insulator film 11.

Now, a structure of a memory cell array constituted by using the memory cell shown in FIG. 2 will be described with reference to FIG. 3, which is a layout pattern diagram of a portion of a memory cell array constituted of the memory cell shown in FIG. 2. This memory is in a NAND structure, and a portion thereof is in a contactless cell structure.

Figure 3:
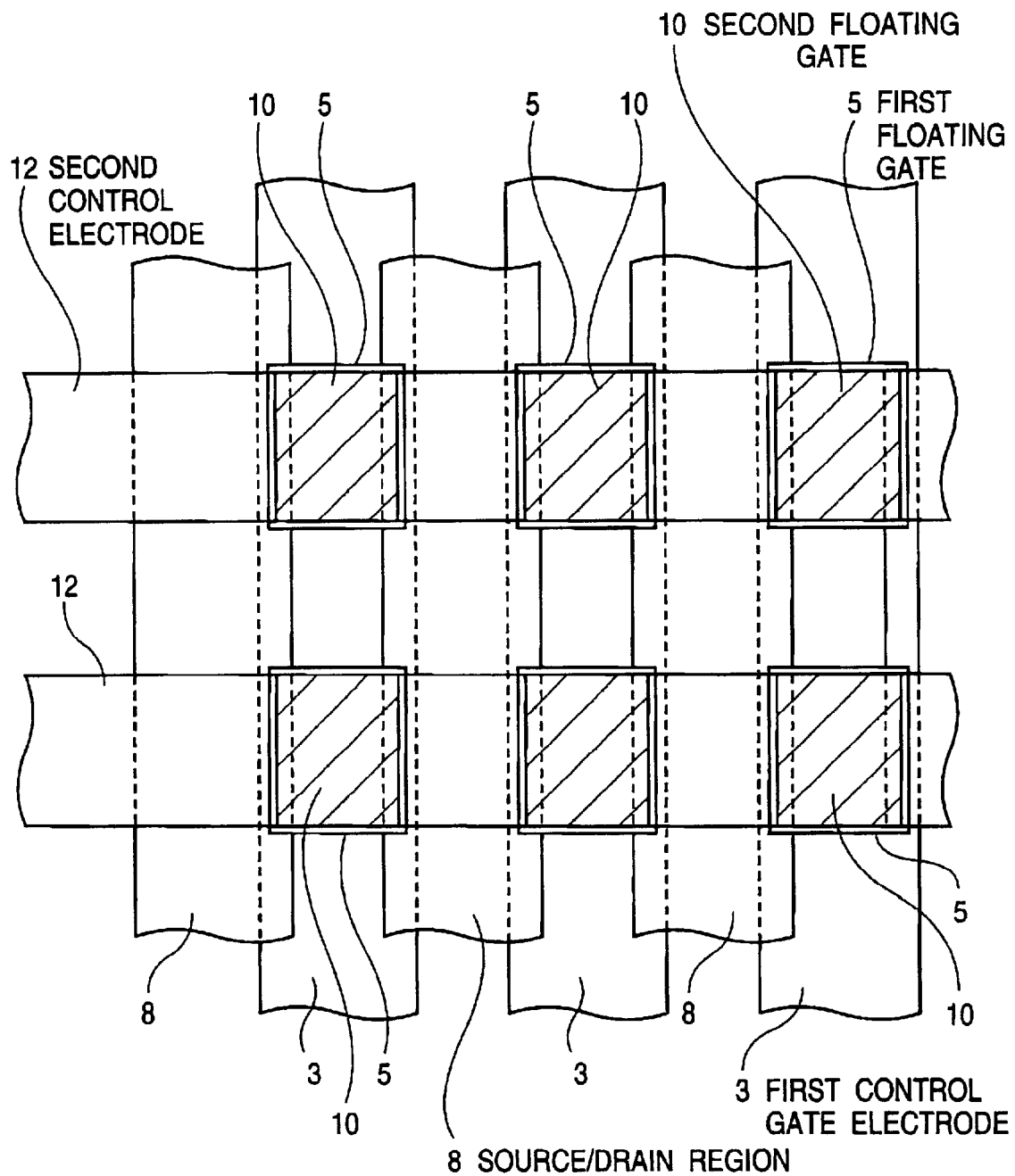
FIG. 3 is a layout pattern diagram of a portion of a memory cell array constituted of the memory cell shown in FIG. 2.

As shown in FIG. 3, a plurality of first control gate electrodes 3 (each of constituted of the diffused layer 3 shown in FIG. 2) are formed in the form of an elongated strip, and are arranged at constant intervals in a direction perpendicular to a lengthwise direction of the elongated strip-like control gate electrodes 3. Similarly, a plurality of source/drain regions 8 are formed in the form of an elongated strip, and each one of the source/drain regions 8 is located to position between a pair of adjacent first control gate electrodes 3 and to partially overlap the first control gate electrodes 3. The first floating gate electrode 5 and the second floating gate electrode 10 are formed to completely overlap the source region 7 and to bridge the pair of source/drain regions 8 at opposite sides of the source region 7. In FIG. 3, the second floating gate electrode 10 is hatched for making it clearly understandable.

Further, the second control gate electrodes 12 are formed in the form of an elongated strip, and are arranged at constant intervals in the lengthwise direction of the elongated strip-like control gate electrodes 3.

The second control gate electrodes 12 are formed to completely cover the second floating gate electrode 10.

The non-volatile memory cell having the above mentioned structure is equivalent to two floating gate transistors connected in parallel. Namely, a first floating gate transistor is formed of the channel region 7, the source/drain regions 8, a floating gate electrode constituted of the first floating gate electrode 5 formed under the second gate insulator film 6 in contact with a lower surface of the channel region 7, and a control gate electrode constituted of the diffused layer 3 formed under the first gate insulator film 4 in contact with a lower surface of the first floating gate electrode 5. A second floating gate transistor is formed of the channel region 7, the source/drain regions 8, a floating gate electrode constituted of the second floating gate electrode 10 formed on the third gate insulator film 9 in contact with an upper surface of the channel region 7, and a control gate electrode constituted of the second control electrode 12 formed over the fourth gate insulator film 11 in contact with an upper surface of the second floating gate electrode 10.

In addition, a first channel region of the first floating gate transistor is formed in a portion of the channel region 7 adjacent to the second gate insulator film 6, and a second channel region of the second floating gate transistor is formed in a portion of the channel region 7 adjacent to the third gate insulator film 9. The thickness of the channel region 7 is designed to ensure that the first channel region and the second channel region is prevented from being in contact with each other.

Thus, the non-volatile semiconductor memory in accordance with the present invention can store information in a multi-value condition, and therefore, can be reduce the occupying area per bit, thereby to become possible to realize a super high integration density.

Now, an operation for reading the multi-value information from the non-volatile semiconductor memory in accordance with the present invention having the above mentioned structure will be described. Here, it is assumed that the accumulated amount of electrons in the first floating gate electrode is Q1L when electrons are removed and Q1H when electrons are injected, and the accumulated amount of electrons in the second floating gate electrode is Q2L when electrons are removed and Q2H when electrons are injected. In addition, it is also assumed that drain currents corresponding to the accumulated electron amounts Q1L, Q1H, Q2L and Q2H, respectively, are I1L, I1H, I2L and I2H, respectively.

Here, if a reading voltage is applied simultaneously to the two control gate electrodes 3 and 12, the drain current of the non-volatile memory cell assumes four values, depending upon whether or not the electrons are accumulated in the first floating gate electrode and the second floating gate electrode. However, under a certain combination of some structure of the floating gate transistors with the electron injection amount, it becomes I1L=I2L and I1H=I2H, so that I1L+I2H=I1H+I2L, so that only three different transistor driving powers can be obtained. Therefore, in order that at least one of I1L≠I2L and I1H≠I2H be hold, it is necessary to make the thickness of the second gate insulator film 6 different from the thickness of the third gate insulator film 9. In the case that these conditions are fulfilled, a relation between the electron accumulating amount of each floating gates and the current flowing through the channel will be discussed in the following.

Here, respective values of I1L, I1H, I2L and I2H are preferably set to fulfill such a relation that {I1L+I2L}, {I1H+I2L}, {I1L+I2H} and {I1H+I2H} are separated at equal intervals, namely, at equal differences, since it becomes easy to distinguish each condition from the other conditions. For example, the electron amounts Q1L, Q1H, Q2L and Q2H are selected to realize a relation of I1L:I1H:I2L:I2H=2:2:0:1. In this case, a current ratio under four different conditions becomes {I1L+I2L}: {I1H+I2L}: {I1L+I2H}: {I1H+I2H}= 4:3: 2:1. Namely, {I1L+I2L}, {I1H+I2L}, {I1L+I2H} and {I1H+I2H} are separated at equal intervals, and therefore, the four different conditions corresponding to four values can be easily distinguished by a sense amplifier. In this case, if three different reference currents are used for the sense amplifiers, it is possible to distinguish the stored information of four values, in comparison with the three reference currents.

On the other hand, an operating for writing information into the non-volatile semiconductor memory cell in accordance with the present invention is executed independently for each one of the two floating transistors. A writing method is the same as that for a prior art floating gate transistor type memory cell.

Now, a process for manufacturing the non-volatile semiconductor memory cell shown in FIG. 2 will be described with reference to FIGS. 4A to 4G, which are diagrammatic section views illustrating a process for manufacturing the non-volatile semiconductor memory cell shown in FIG. 2.

Figure 4A:
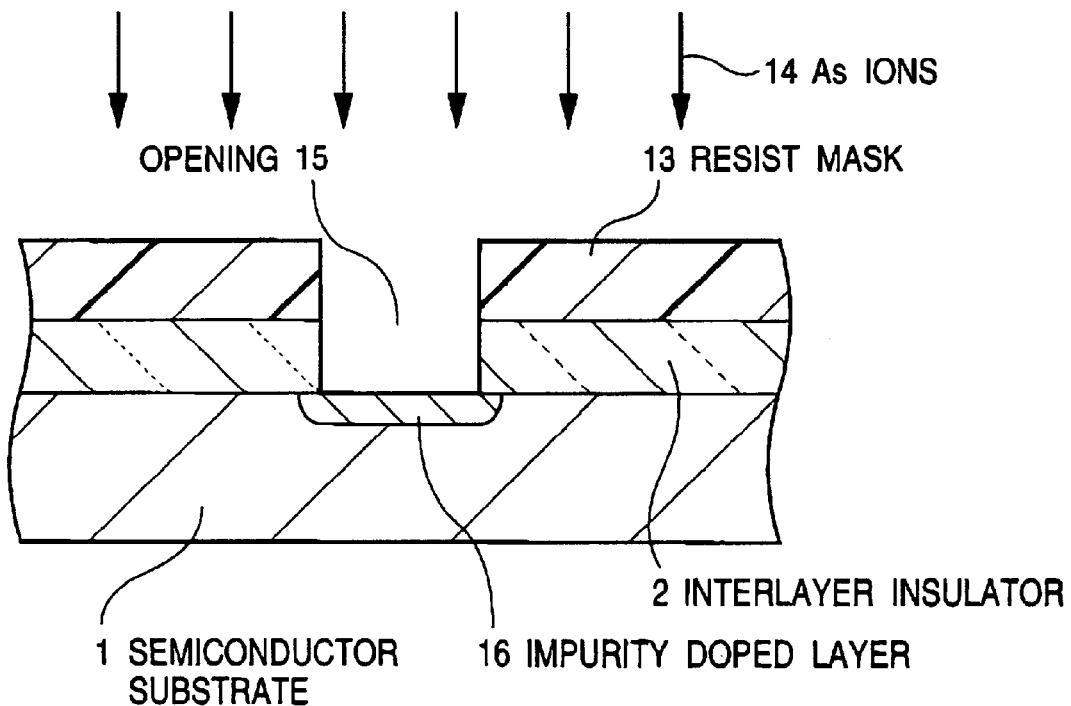
FIGS. 4A to 4G are diagrammatic section views illustrating a process for manufacturing the non-volatile semiconductor memory cell shown in FIG. 2.

As shown in FIG. 4A, the interlayer insulator film 2 and a resist layer 13 are formed on a principal surface of the semiconductor substrate 1, and then, patterned by a photolithography and a dry etching to have an opening 15 in which the principal surface of the semiconductor substrate 1 is exposed. This opening 15 extends in the same direction as the lengthwise direction of the diffused layer 3 shown in FIG. 3. For example, the semiconductor substrate 1 is formed of a P-type silicon substrate, and the interlayer insulator film 2 is formed of a silicon oxide film having a thickness of about 100 nm. By using the resist layer 13 as a mask, arsenic ions 15 are ion-implanted through the opening 15 onto the principal surface of the semiconductor substrate 1. Thus, an impurity doped layer 16 is formed on principal surface of the semiconductor substrate 1 within the opening 15.

Figure 4B:
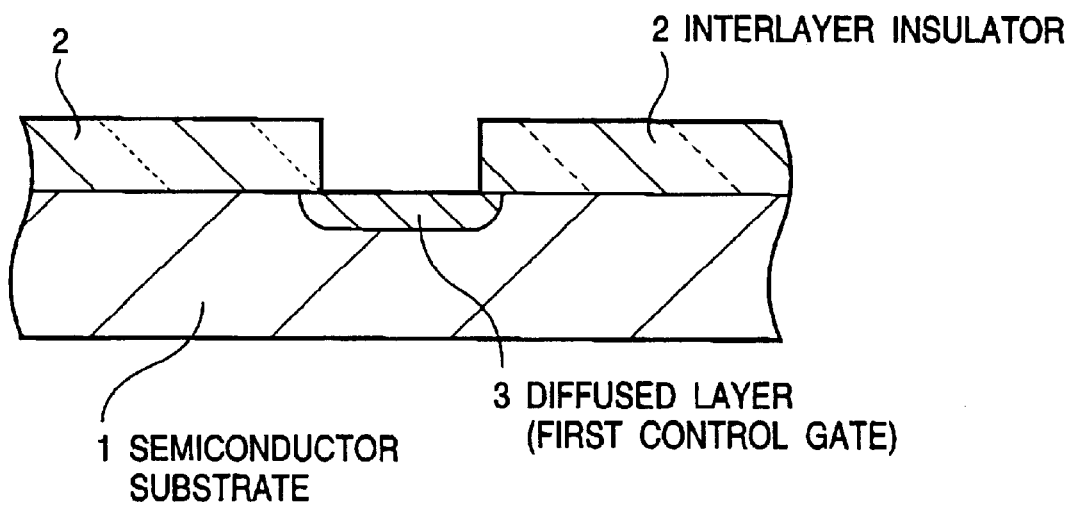

Thereafter, the resist layer 13 is removed, and a heat treatment is conducted. Thus, there is obtained the semiconductor substrate 1 having a diffused layer 3 formed in the principal surface thereof and the interlayer insulator 2 formed on the principal surface of the semiconductor substrate 1 but having the opening 15, as shown in FIG. 4B.

Figure 4C:
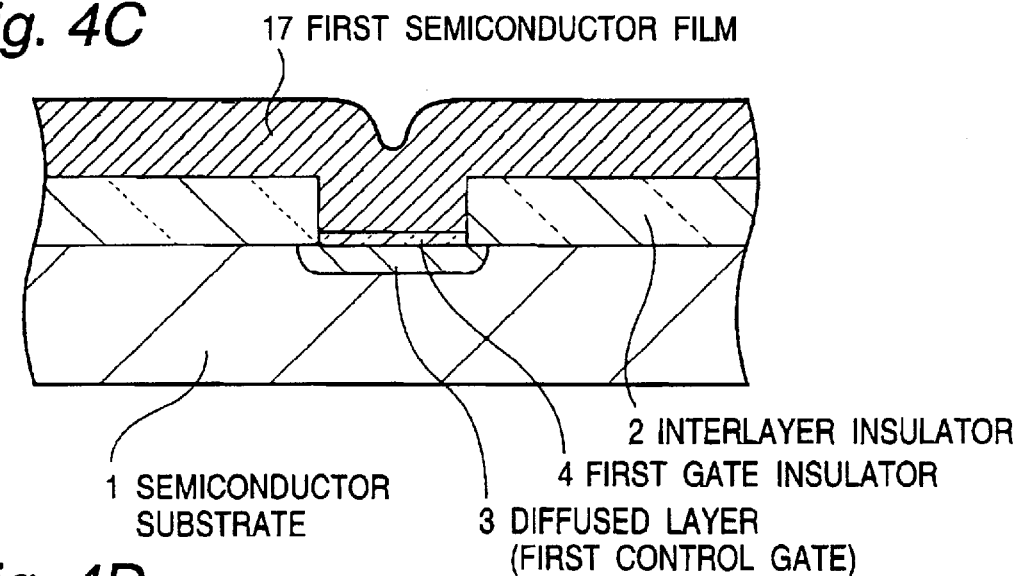

Then, as shown in FIG. 4C, a first gate insulator film 4 is formed on a surface of the diffused layer 3. For example, this first gate insulator film 4 is formed of a silicon oxide film obtained by a thermal oxidation and having a thickness of about 15 nm. Furthermore, a first semiconductor film 17 is deposited by a chemical vapor deposition (CVD) process. For example, this first semiconductor film 17 is formed of a phosphorus containing polysilicon film having a thickness of about 150 nm.

Figure 4D:
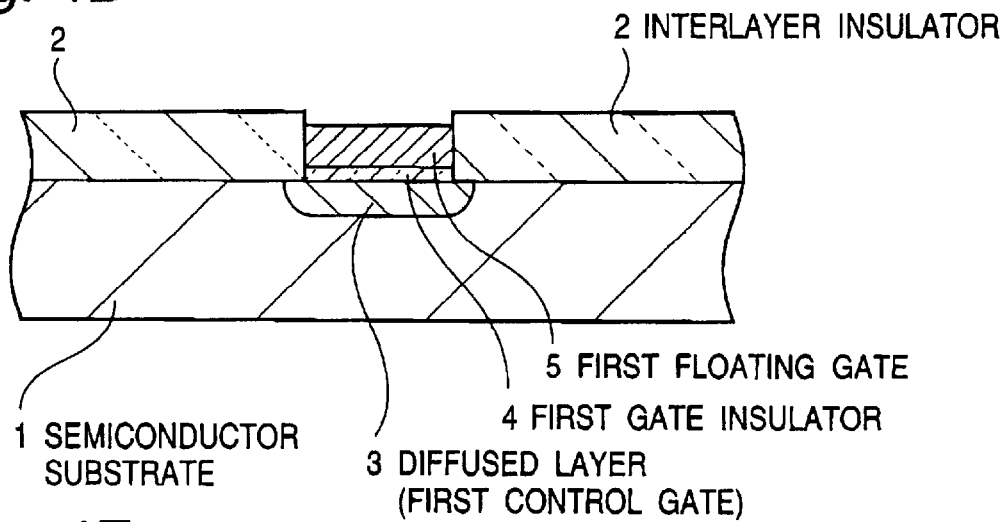

The first semiconductor film 17 is polished by a chemical mechanical polishing (CMP) process. Thus, the first floating gate electrode 5 is formed on the first gate insulator film 4 and embedded in the interlayer insulator film 2, as shown in FIG. 4D. Here, it is so formed that the surface of the first floating gate electrode 5 is lower than the surface of the interlayer insulator film 2. Namely, the first floating gate electrode 5 is retreats in comparison with the surface of the interlayer insulator film 2.

Figure 4E:
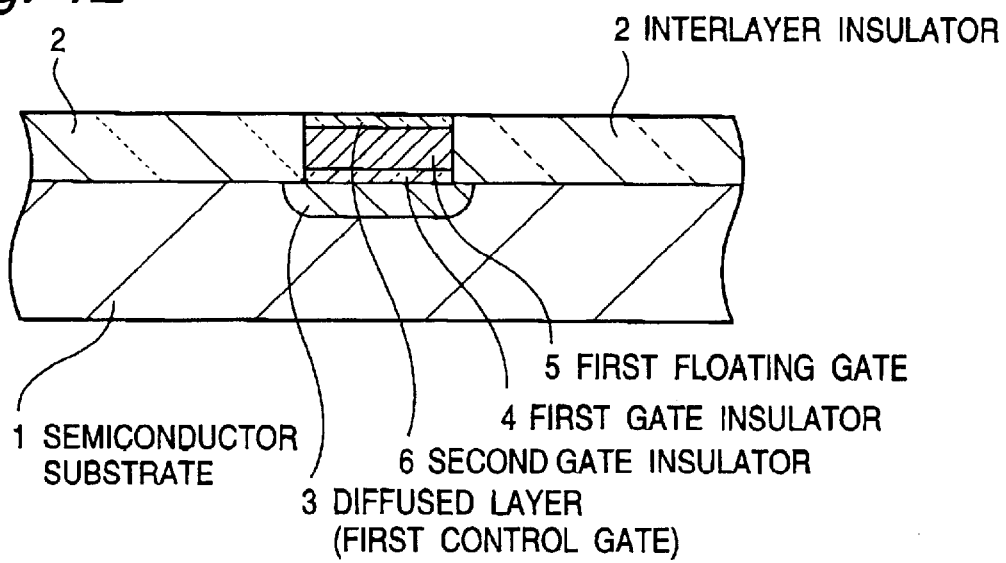

As shown in FIG. 4E, a surface of the first floating gate electrode 5 is thermally oxidized to form the second gate insulator film 6. For example, this second gate insulator film 6 is formed of a silicon oxide film having a thickness of about 10 nm.

Figure 4F:
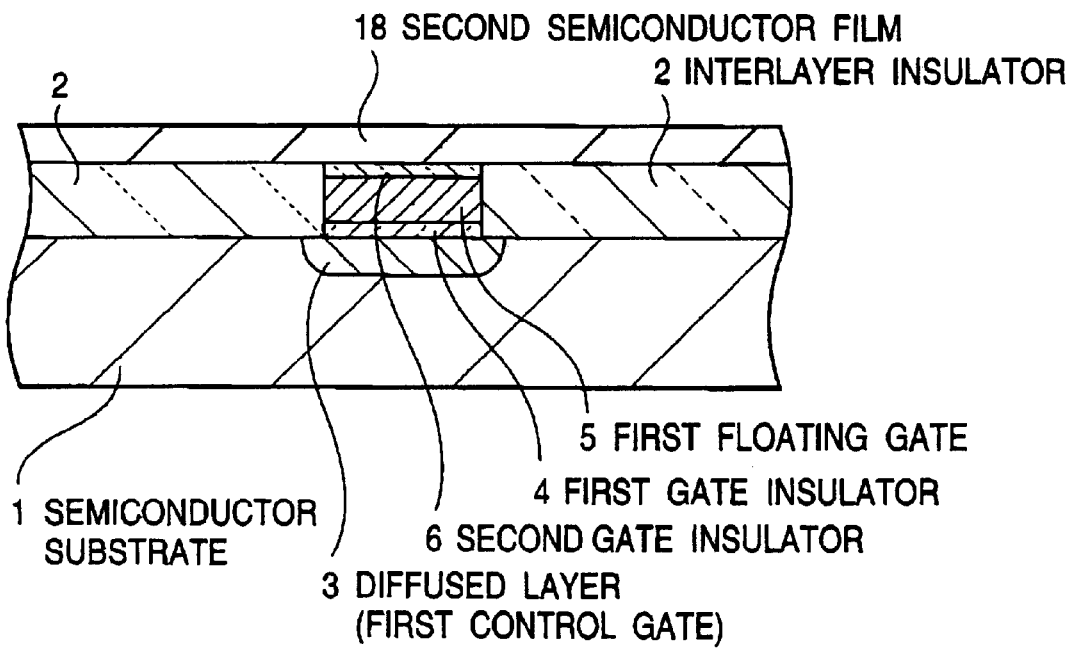

As shown in FIG. 4F, a second semiconductor film 18 is deposited to cover the interlayer insulator film 2 and the second gate insulator film 6. For example, the second semiconductor film 18 is formed of a silicon film having a thickness of about 150 nm. This silicon film can be a polysilicon, an amorphous silicon and a single crystalline silicon. The second semiconductor film 18 includes boron with the impurity concentration of $10^{17}$ atoms/cm$^3$.

Then, the second semiconductor film 18 is patterned by a photolithography and a dry etching, to form an island in the form of an elongated strip. This island in the form of an elongated strip has a width capable of completely covering the second gate insulator film 6 and partially covering the interlayer insulator film 2, as shown in FIG. 4F. On the other hand, the island in the form of an elongated strip extends in the same direction as the lengthwise direction of the diffused layer 3 shown in FIG. 3. A surface of the island formed of the second semiconductor film 18 is thermally oxidized to form a silicon oxide film having a thickness of about 15 nm. This silicon oxide film obtained by the thermal oxidation, constitutes the third gate insulator film 9, as shown in FIG. 4G.

Figure 4G:
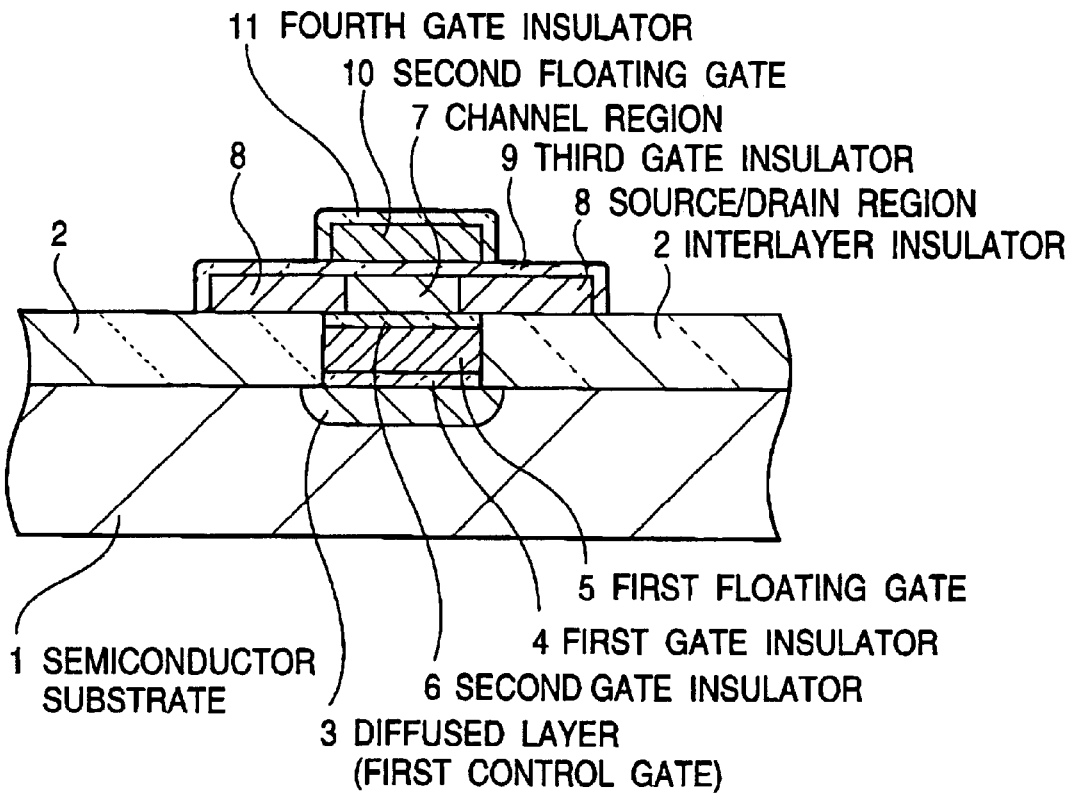

Furthermore, the second floating gate electrode 10 in the form of an elongated strip extending in the same direction as the lengthwise direction of the diffused layer 3 shown in FIG. 3, is formed on the third gate insulator film 9 as shown in FIG. 4G. This second floating gate electrode 10 contains phosphorus as impurity. By using the second floating gate electrode 10 as a mask, arsenic ions are selectively ion-implanted into the island formed of the second semiconductor film 18, and a heat treatment is conducted. Thus, in the island formed of the second semiconductor film 18, a pair of source/drain regions 8 are formed to be separated from each other by a channel region 7. Then, a fourth gate insulator film 11 is formed on a surface of the second floating gate electrode 10. This fourth gate insulator film 11 is formed of a silicon oxide film having a thickness of about 15 nm.

Finally, as shown in FIG. 2, the second control gate electrode 12 is formed to cover the second floating gate electrode 10 and the source/drain regions 8 and to extend in a direction orthogonal to the lengthwise direction of the diffused layer 3 shown in FIG. 3. By using the second control gate electrode 12 as a mask, the second floating gate electrode 10 of the elongated strip form and the elongated strip of the second semiconductor film 18 are selectively removed or etched to be divided into a plurality of unitary second control gate electrodes 12 and a plurality of unitary channel regions, one for each memory cell.

Thus, the non-volatile semiconductor memory cell in accordance with the present invention as shown in FIG. 2 is completed.

Now, a second embodiment of the non-volatile semiconductor memory cell in accordance with the present invention will be described with reference to FIG. 5 which is a diagrammatic section view of the second embodiment of the non-volatile semiconductor memory cell in accordance with the present invention.

The shown non-volatile semiconductor memory cell has an interlayer insulator film 22 selectively formed on a semiconductor substrate 21 of a first conductivity type. A diffused layer 23 of a second conductivity type opposite to the first conductivity type, is formed in a principal surface of the semiconductor substrate 21 within an opening formed to penetrate through the interlayer insulator film 22 at a predetermined area. In addition, a silicide layer 24 is selectively formed in a surface region of the diffused layer 23. This silicide layer 24 constitutes a first control electrode in the non-volatile semiconductor memory cell in accordance with the present invention.

A first gate insulator film 25 is formed on a surface of the silicide layer 24 and a surface of the interlayer insulator film 22 including a side surface of the opening, and a first floating gate electrode 26 is formed on the first gate insulator film 25 so that the first floating gate electrode 26 is completely embedded within the opening of the interlayer insulator film 22. In addition, a second gate insulator film 27 is formed on a surface of the first floating gate electrode 26 so that a surface of the second gate insulator film 27 is flush with the surface of the first gate insulator film on the interlayer insulator film 22.

Furthermore, a channel region 28 for a thin film transistor is formed on the second gate insulator film 27, and a pair of source/drain regions 29 are formed at both sides of the channel region 28 on the second gate insulator film 27 and the first gate insulator film 25. A third gate insulator film 30 is formed to cover the channel region 28 and the source/drain regions 29.

A second floating gate electrode 31 is formed on the third gate insulator film 30 at a position above the channel region 28 of the thin film transistor. A fourth gate insulator film 32 is formed to completely cover a surface of the second floating gate electrode 31, the third gate insulator film 30 and the first gate insulator film 25. A second control gate electrode 33 is formed to cover the fourth gate insulator film 32.

Now, a process for manufacturing the non-volatile semiconductor memory cell shown in FIG. 5 will be described with reference to FIGS. 6A to 6G, which are diagrammatic section views illustrating a process for manufacturing the non-volatile semiconductor memory cell shown in FIG. 5.

Figure 6A:
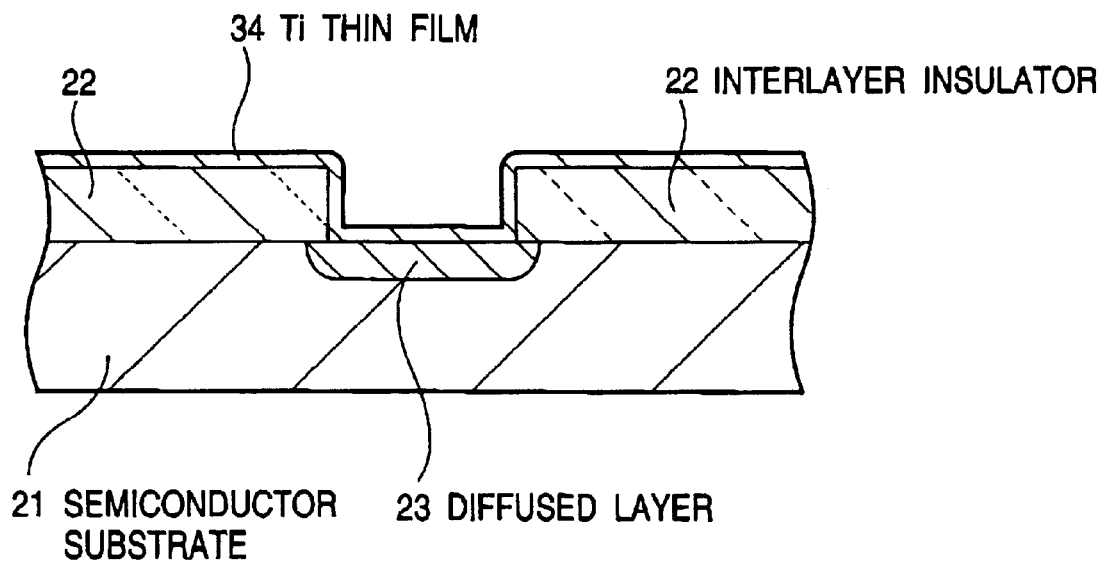
FIGS. 6A to 6G are diagrammatic section views illustrating a process for manufacturing the non-volatile semiconductor memory cell shown in FIG. 5.

As shown in FIG. 6A, the patterned interlayer insulator film 22 have an opening is formed on a principal surface of the semiconductor substrate 21. For example, the semiconductor substrate 21 is formed of a P-type silicon substrate, and the interlayer insulator film 22 is formed of a silicon oxide film having a thickness of about 200 nm. Arsenic ions are ion-implanted onto the principal surface of the semiconductor substrate 21 within the opening of the patterned interlayer insulator film 22, and then, a heat treatment is conducted. Thus, a diffused layer 23 is formed on principal surface of the semiconductor substrate 21 within the opening of the patterned interlayer insulator film 22.

Figure 6B:
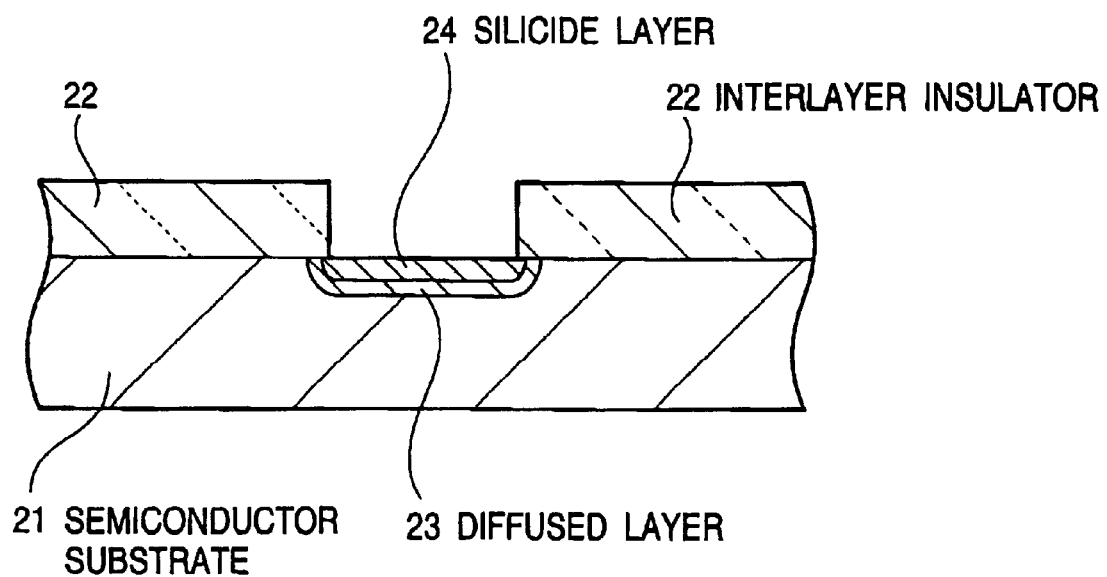

Thereafter, a titanium thin film 34 is deposited by a sputtering. For example, a thickness of the titanium thin film 34 is on the order of 20 nm. Furthermore, a heat treatment is conducted so that silicon of the diffused region 23 reacts with the titanium thin film 34 to form a silicide film. Thereafter, non-reacted titanium thin film is removed. Thus, a silicide layer 24 is formed on a surface of the diffused region 23 as shown in FIG. 6B. On the other hand, no silicide layer is formed on the interlayer insulator film 22.

Figure 6C:
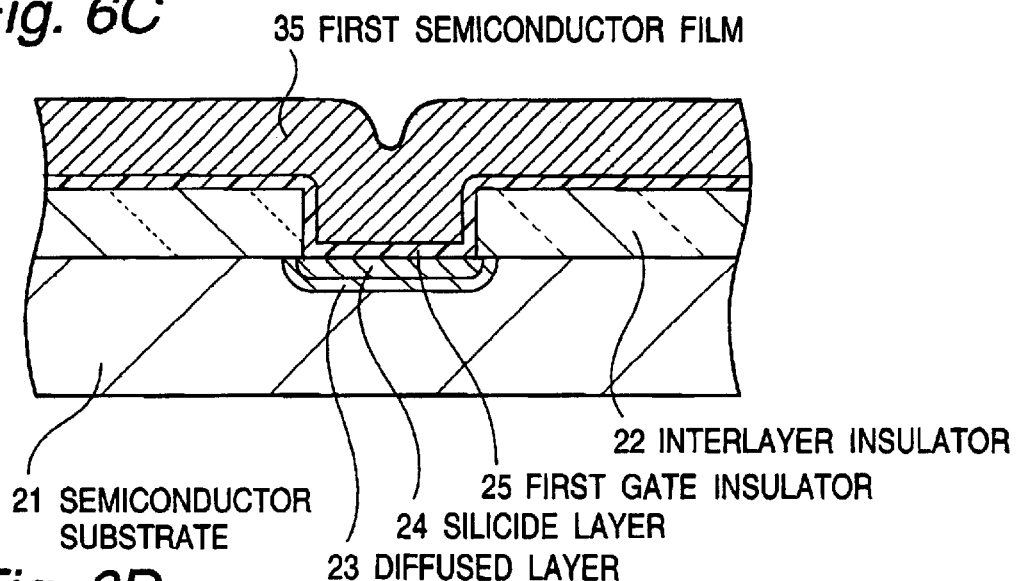

Then, as shown in FIG. 6C, a first gate insulator film 25 is formed on a surface of the silicide layer 24 and a surface of the interlayer insulator film 22. For example, this first gate insulator film 25 is formed of a multilayer film composed of a silicon oxide film, a silicon nitride film and a silicon oxide film (ONO film), and has a thickness of about 10 nm calculated in terms of a silicon oxide film thickness. A first semiconductor film 35 is deposited by a chemical vapor deposition (CVD) process. For example, this first semiconductor film 17 is formed of a phosphorus containing polysilicon film having a thickness of about 250 nm.

Figure 6D:
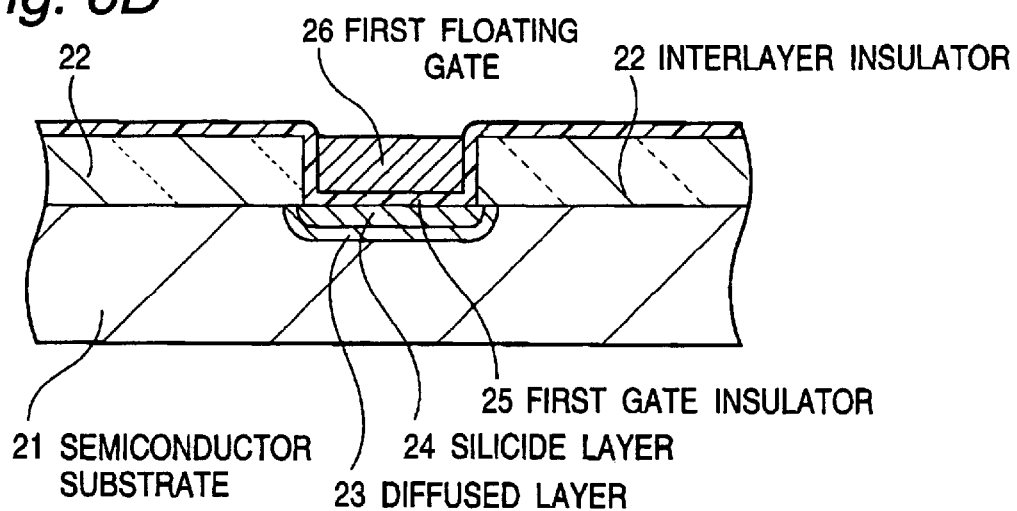

The first semiconductor film 35 is polished by a chemical mechanical polishing (CMP) process. Thus, the first floating gate electrode 26 is formed on the first gate insulator film 25 and embedded in the interlayer insulator film 22, as shown in FIG. 6D.

Figure 6E:
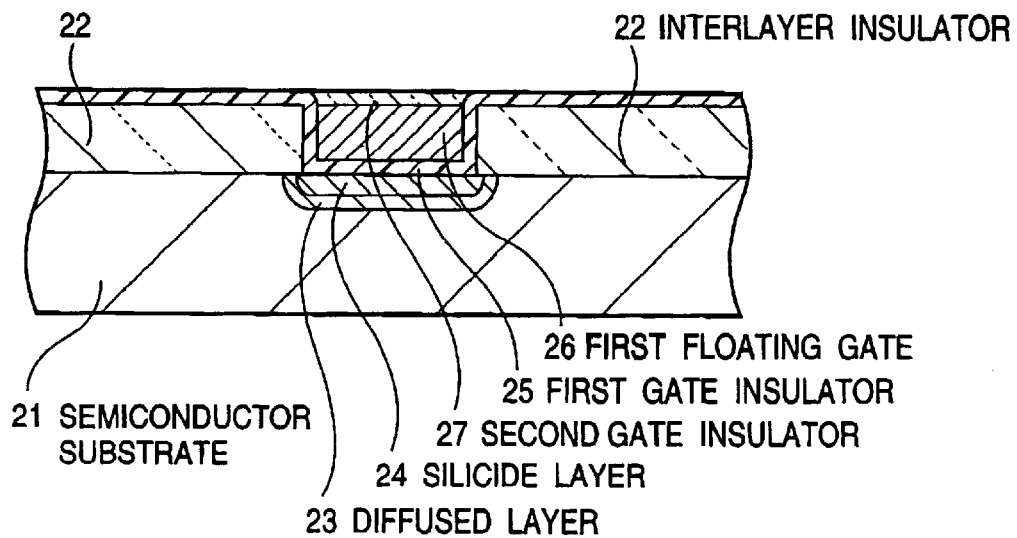

As shown in FIG. 6E, a surface of the first floating gate electrode 26 is thermally oxidized to form the second gate insulator film 27. For example, this second gate insulator film 27 is formed of a silicon oxide film having a thickness of about 15 nm.

Figure 6F:
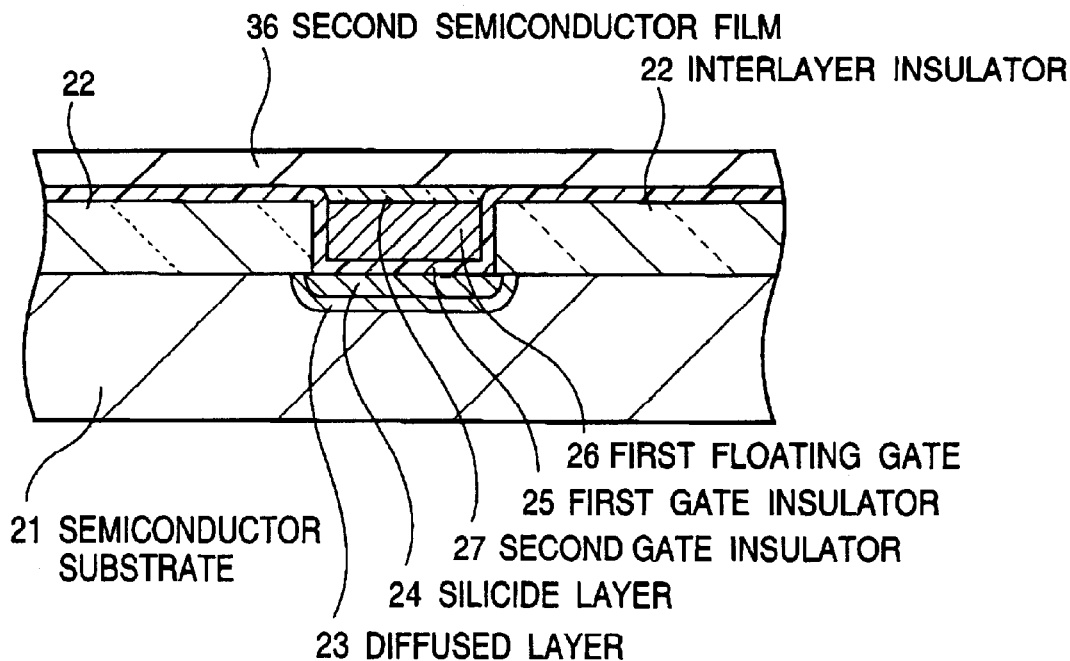

As shown in FIG. 6F, a second semiconductor film 36 is deposited to cover the first gate insulator film 25 and the second gate insulator film 27. For example, this second semiconductor film 36 is formed of a silicon film having a thickness of about 100 nm. This silicon film can be a polysilicon, an amorphous silicon and a single crystalline silicon. The second semiconductor film 36 includes boron with the impurity concentration of $10^{17}$ to $10^{18}$ atoms/cm$^3$.

Then, the second semiconductor film 36 is patterned by a photolithography and a dry etching, to form an island which crosses the first floating gate electrode 26. A surface of the island formed of the second semiconductor film 36 is thermally oxidized to form a silicon oxide film having a thickness of about 10 nm. This silicon oxide film obtained by the thermal oxidation, constitutes the third gate insulator film 30, as shown in FIG. 6G.

Figure 6G:
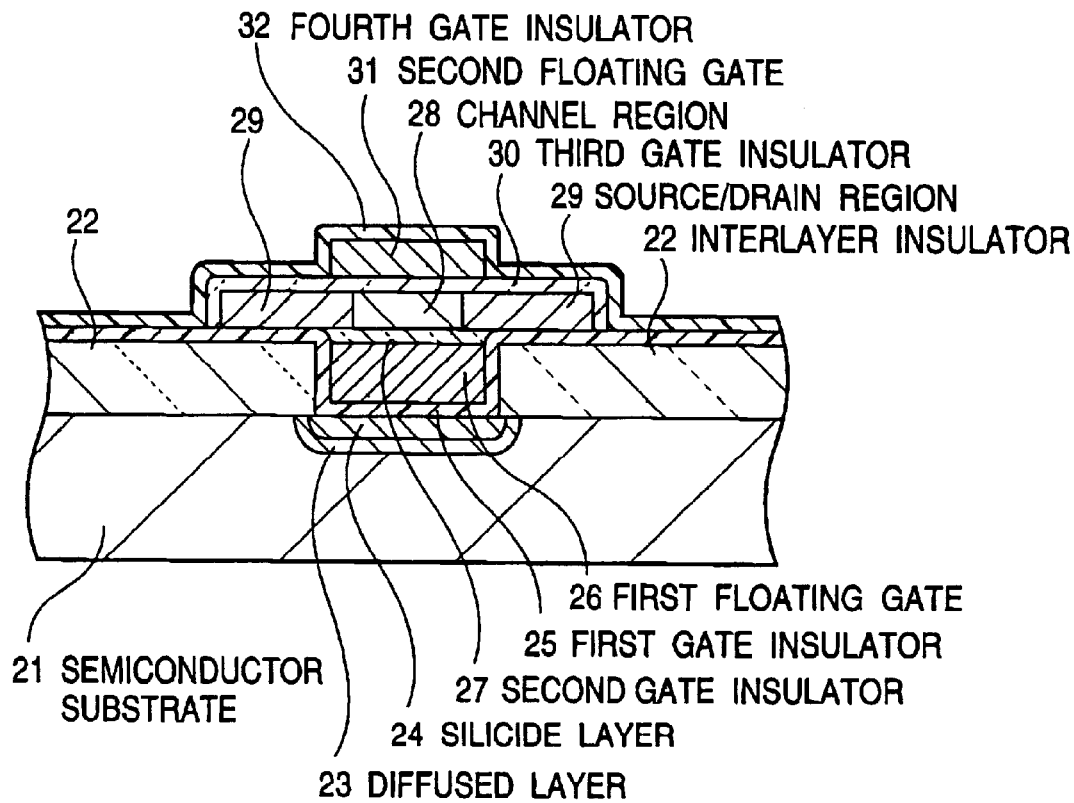

Furthermore, the second floating gate electrode 31 patterned as shown in FIG. 6G is formed on the third gate insulator film 30. This second floating gate electrode 31 contains phosphorus as impurity. By using the second floating gate electrode 31 as a mask, arsenic ions are selectively ion-implanted into the island formed of the second semiconductor film 36, and a heat treatment is conducted. Thus, in the island formed of the second semiconductor film 36, a pair of source/drain regions 29 are formed to be separated from each other by a channel region 28.

Then, a fourth gate insulator film 32 is formed on a whole surface 25 including a surface of the second floating gate electrode 31. This fourth gate insulator film 32 is formed of a ONO film having a thickness of about 15 nm calculated in terms of a silicon oxide film thickness.

Figure 5:
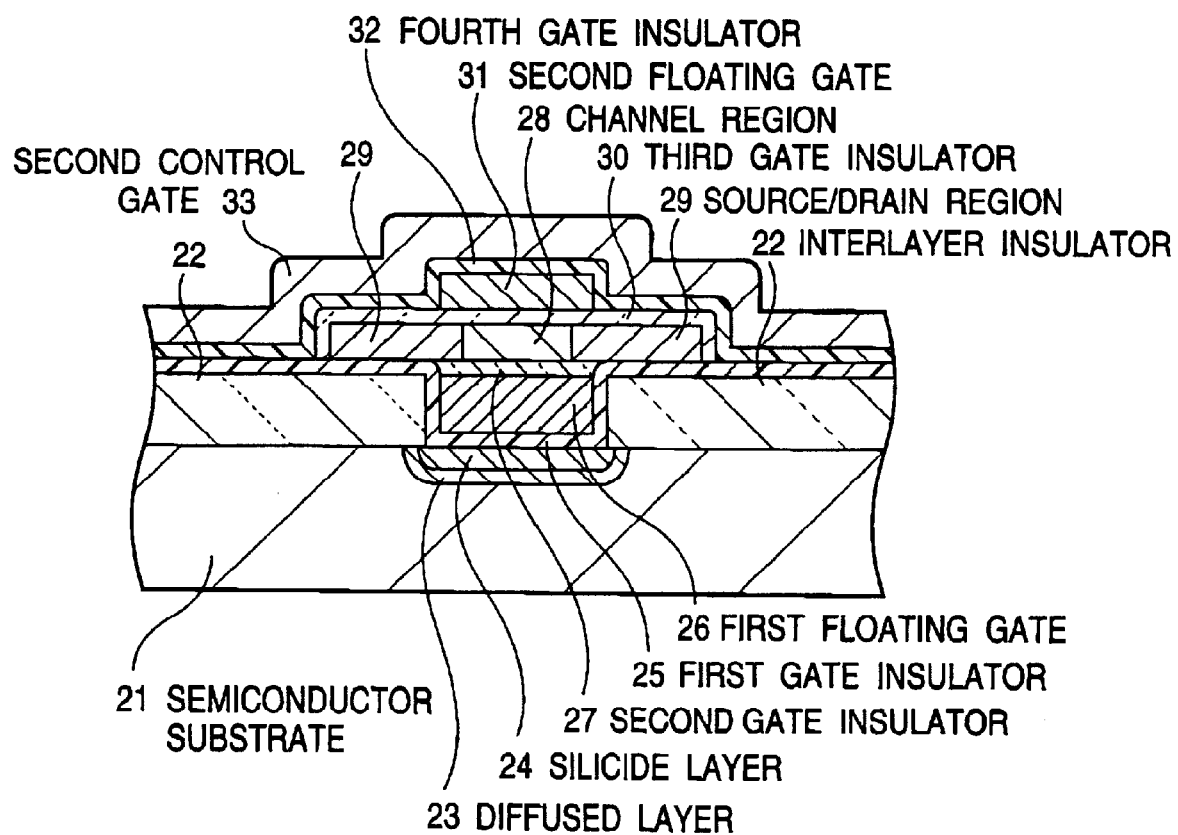
FIG. 5 is a diagrammatic section view of a second embodiment of the non-volatile semiconductor memory cell in accordance with the present invention.

Finally, as shown in FIG. 5, the second control gate electrode 33 is formed on the fourth gate insulator film 32 to extend over the second floating gate electrode 31 and the source/drain regions 29. Thus, the non-volatile semiconductor memory cell in accordance with the present invention as shown in FIG. 5 is completed.

In this second embodiment, the silicide layer 24 is formed on the diffused layer 23. When the non-volatile memory cell of this second embodiment is used as a memory cell of a non-volatile semiconductor memory, the silicide layer 24 functions not only as the first control gate electrode but also as a word line. Therefore, a resistance of the word line can be greatly reduced in comparison with the first embodiment, with the result that an operation speed of the non-volatile semiconductor memory can be elevated in comparison with the first embodiment.

As seen from the above, in the floating gate transistor type non-volatile semiconductor memory in accordance with the present invention, one memory cell can store a four-value information, and therefore, can be reduce the occupying area per bit, with the result that a super high integration density can be easily realized.

Comparing in the same design standard, the non-volatile semiconductor memory in accordance with the present invention can realize integration density which is two times of that of the prior art non-volatile semiconductor memory.

The invention has thus been shown and described with reference to the specific embodiments. However, it should be noted that the present invention is in no way limited to the details of the illustrated structures but changes and modifications may be made within the scope of the appended claims.

I claim:

1. A non-volatile semiconductor memory including a non-volatile semiconductor memory cell comprising:

a semiconductor substrate of a first conductivity type, said substrate having a diffused region;

an insulating layer covering a principal surface of said semiconductor substrate; said insulating layer having an opening penetrating through said insulating layer to said diffused region;

a first control electrode formed in said principal surface of said semiconductor substrate within said opening of said insulating layer, said first control electrode being electrically isolated from said semiconductor substrate;

a first gate insulator film formed on said diffused region within said opening of said insulating layer;

a first floating gate electrode formed on said first gate insulator film within said opening of said insulating layer;

a second gate insulator film formed to cover a surface of said first floating gate electrode;

a semiconductor thin film formed to cover said second gate insulator film and to partially cover said insulating layer, said semiconductor thin film including a channel region positioned above said first floating gate electrode and a pair of source/drain regions separated from each other by said channel region and partially covering said insulating layer;

a third gate insulator film formed to cover said semiconductor thin film;

a second floating gate electrode formed on said third gate insulator film to extend over said channel region of said semiconductor thin film;

a fourth gate insulator film formed to cover said second floating gate electrode; and a second control gate electrode formed on said fourth gate insulator film, so that a first floating gate transistor is formed of said channel region, said pair of source/drain regions, said first floating gate electrode and said first control electrode, and a second floating gate transistor is formed of said channel region, said pair of source/drain regions, said second floating gate electrode and said second control gate electrode, whereby one memory cell is constituted of said first and second floating gate transistors to be able to store multi-value information.

2. A non-volatile semiconductor memory claimed in claim 1 wherein said first control electrode is constituted of a diffused region formed in said principal surface of said semiconductor substrate within said opening of said insulating layer, said diffused region being of a second conductivity type opposite to said first conductivity type.

3. A non-volatile semiconductor memory claimed in claim 2 wherein a film thickness, calculated in terms of a silicon oxide film thickness, of said second gate insulator film, is different from that of said third insulator film.

4. A non-volatile semiconductor memory claimed in claim 3 wherein a first channel region of said first floating gate transistor is constituted of a portion of said channel region adjacent to said second gate insulator film, and a second channel region of said second floating gate transistor is constituted of a portion of said channel region adjacent to said third gate insulator film, said semiconductor thin film having a thickness to prevent said first channel region and said second channel region from being in contact with each other.

5. A non-volatile semiconductor memory claimed in claim 1 wherein said memory cell further includes a diffused region formed in said principal surface of said semiconductor substrate within said opening of said insulating layer, said diffused region being of a second conductivity type opposite to said first conductivity type, and said first control gate electrode is constituted of a silicide layer which is formed in a surface region of said diffused layer and which is in contact with said first gate insulator film, so that said first floating gate transistor being formed of said channel region, said pair of source/drain regions, said first floating gate electrode and said silicide layer.

6. A non-volatile semiconductor memory claimed in claim 5 wherein a film thickness, calculated in terms of a silicon oxide film thickness, of said second gate insulator film, is different from that of said third insulator film.

7. A non-volatile semiconductor memory claimed in claim 6 wherein a first channel region of said first floating gate transistor is constituted of a portion of said channel region adjacent to said second gate insulator film, and a second channel region of said second floating gate transistor is constituted of a portion of said channel region adjacent to said third gate insulator film, said semiconductor thin film having a thickness to prevent said first channel region and said second channel region from being in contact with each other.

8. A semiconductor device, comprising:

a semiconductor substrate;

a first control gate formed in said semiconductor substrate;

a first insulating layer formed on said first control gate;

a first floating gate formed on said first insulating layer;

a second insulating layer formed on said first floating gate;

a channel region formed on said second insulating layer;

a third insulating layer formed on said channel region;

a second floating gate formed on said third insulating layer;

a fourth insulating layer formed on said second floating gate; and a second control gate formed on said fourth insulating layer, wherein current through said channel region varies according to charges stored in said first and second floating gates.

9. A semiconductor device, according to claim 8, further comprising:

an interlayer insulating layer, disposed on said semiconductor substrate, wherein said first floating gate is disposed substantially within a plane containing said interlayer insulating layer.

10. A semiconductor device, according to claim 8, wherein said first control gate is disposed substantially within a plane containing said semiconductor substrate.

11. A semiconductor device, according to claim 10, wherein said first control gate is a silicide layer.

12. A semiconductor device, according to claim 8, wherein a first ratio of channel region current to charges stored in said first floating gate is different than a second ratio of channel region current to charges stored in said second floating gate.

13. A semiconductor device, according to claim 12, wherein said second insulating film has a thickness different from said third insulating film.

14. A semiconductor device, according to claim 12, wherein a first total current flows through said channel region in response to said first and second floating gates both have charges injected therein, a second total current flows through said channel region in response to said first floating gate having charges injected therein and said second floating gate having charges removed therefrom, a third total current flows through said channel region in response to said first floating gate having charges removed therefrom and said second floating gate having charges injected therein, and a fourth total current flows through said channel region in response to said first and second floating gates having charges removed therefrom, wherein none of said total currents equal any other of said total currents.

15. A semiconductor device, according to claim 14, wherein said second insulating film has a thickness different from said third insulating film.

16. A semiconductor device, comprising:

a substrate;

a first gate assembly having a first floating gate separated from a first control gate by a first insulating layer, said first control gate being within said substrate;

a second gate assembly having a second floating gate separated from a second control gate by a second insulating layer; and a channel region, operatively coupled to said first and second gate assemblies, wherein current through said channel region is controlled by said first and second gate assemblies.

17. A semiconductor device, according to claim 16, wherein said first gate assembly is operatively coupled to said channel region by a third insulating film on a first side of said channel region and said second gate assembly is operatively coupled to said channel region by a fourth insulating film on a second side of said channel region.

18. A semiconductor device, according to claim 17, wherein a thickness of said third insulating film is different than a thickness of said fourth insulating film.

19. A semiconductor device, according to claim 16, wherein a first ratio of channel region current to charges stored by said first gate assembly is different than a second ratio of channel region current to charges stored by said second gate assembly.

20. A semiconductor device, according to claim 19, wherein a first total current flows through said channel region in response to said first and second floating gates both have charges injected therein, a second total current flows through said channel region in response to said first floating gate having charges injected therein and said second floating gate having charges removed therefrom, a third total current flows through said channel region in response to said first floating gate having charges removed therefrom and said second floating gate having charges injected therein, and a fourth total current flows through said channel region in response to said first and second floating gates having charges removed therefrom, wherein none of said total currents equal any other of said total currents.

* * * * *